(12) United States Patent
Xu

(10) Patent No.: US 9,366,955 B2
(45) Date of Patent: Jun. 14, 2016

(54) EXPOSURE MASK AND FABRICATION METHOD FOR COLOR FILTER

(71) Applicant: Shenzhen China Star Optoelectronics Technology Co., Ltd., Shenzhen, Guangdong (CN)

(72) Inventor: Liang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 246 days.

(21) Appl. No.: 14/359,116

(22) PCT Filed: Apr. 11, 2014

(86) PCT No.: PCT/CN2014/075132
§ 371 (c)(1),
(2) Date: May 19, 2014

(87) PCT Pub. No.: WO2015/149378
PCT Pub. Date: Oct. 8, 2015

(65) Prior Publication Data
US 2015/0286135 A1    Oct. 8, 2015

(30) Foreign Application Priority Data
Apr. 4, 2014    (CN) .......................... 2014 1 0136781

(51) Int. Cl.
*G02B 5/20*    (2006.01)
*G03F 7/00*    (2006.01)
*G03F 1/38*    (2012.01)

(52) U.S. Cl.
CPC ................ *G03F 7/0007* (2013.01); *G03F 1/38* (2013.01)

(58) Field of Classification Search
CPC .............. G03F 1/00; G03F 1/36; G03F 1/38; G03F 1/44; G03F 1/50; G03F 1/54; G03F 7/0007; G02B 5/201; G02B 5/223; G02F 1/133516
USPC ........................................... 430/5, 7; 349/106
See application file for complete search history.

(56) References Cited

U.S. PATENT DOCUMENTS

2005/0019679 A1*   1/2005   Lo .......................... G02B 5/201
                                                              430/7
2010/0259709 A1*  10/2010   Ishigaki ............ G02F 1/133516
                                                              349/106

FOREIGN PATENT DOCUMENTS

| CN | 1731285 A | 2/2006 |
| CN | 103487969 A | 1/2014 |
| CN | 1704847 A | 12/2015 |

* cited by examiner

*Primary Examiner* — John A McPherson
(74) *Attorney, Agent, or Firm* — Andrew C. Cheng

(57) ABSTRACT

The present invention disclose a exposure mask for fabricating a color filter, the exposure mask includes a plurality of exposure regions; and a light-shielding region for isolating the plurality of exposure regions, wherein, an edge of each exposure region is provided with multiple first light-shielding patterns spaced apart with each other. The present invention also discloses a fabrication method for a color filter, comprising steps of: (a) providing a lower glass substrate fabricating having an array of thin film transistor (TFT); (b) fabricating a first insulation protection layer on the array of thin film transistor (TFT); and (c) applying a photolithography process to respectively fabricate color filter units to obtain the color filter; wherein, using the above described exposure mask for exposing.

16 Claims, 2 Drawing Sheets

EXPOSURE MASK AND FABRICATION METHOD FOR COLOR FILTER

BACKGROUND OF THE INVENTION

1. Field of the Invention

The present invention relates to a fabrication method for a liquid crystal panel, and more particular to an exposure mask for fabricating a color filter, and a method for integrating the color filter into a thin film transistor array substrate (Color filter on array, COA).

2. Description of Related Art

The liquid crystal display (LCD) is an ultra-thin and flat display device, which consists of a number of color or monochrome pixels, and placed in front of a light source or a reflection surface. The power consumption of the LCD is very low, and the LCD has features of high-quality, small size, and light weight, such that everyone likes the LCD, and the LCD becomes the mainstream display. Currently, the LCD is mainly the thin-film transistor (TFT) LCD.

The reason that the TFT-LCD can develop rapidly is based on the amorphous silicon platform (of course, a small part of the product uses polysilicon), therefore, the TFT-LCD is cheap, simple in process, and more uniform, so that there are 55 inches, 65 inches large-sized products. When the size of the LCD become larger, the impedance of the circuit is increased, therefore, it is necessary to use a bigger, thicker or better conductivity metal line. The thickness cannot be increased infinitely, and the best material for conductivity is metal silver and copper. The better and useful conductive material cannot be found in a long time. As a result, the only way is increasing the line width; however, the aperture ratio of the TFT-LCD would reduce by this way.

For the shortcoming of the low aperture ratio of the TFT-LCD, there are many solutions to solve this shortcoming from technical point of view, such as using a metal line with lower impedance, using more challenging design, or using some of the new display modes. One of the ways is to integrate a color filter into the TFT array substrate (called Color filter on array, COA). As shown in FIG. 1, which shows a liquid crystal panel using the COA technology, and the liquid crystal panel includes an upper glass substrate 10, a lower glass substrate 20 and a liquid crystal layer 30 disposed between the upper glass substrate 10 and the lower glass substrate 20.

A side of the lower glass substrate 20 close to the liquid crystal layer 30 is provided with a plurality of TFTs 201, each TFT 201 connects to a pixel electrode 205 correspondingly. Usually, a transparent passivation layer is disposed on the pixel electrode 205. Because of using the COA technology, a color filter 203 is disposed between the TFT 201 and the pixel electrode 205. The color filter 203 includes a red color filter unit 203R, a green color filter unit 203G, and a blue color filter unit 203B. Wherein, each pixel electrode 205 corresponds to one red color filter unit 203R, one green color filter 203G, or one blue color filter unit cell 203B. Wherein, between the TFT 201 and the color filter 203, a first insulation protection layer 202 is provided for isolation. Between the color filter 203 and the pixel electrode 205, a second insulation protection layer 204 is provided for isolation. A side of the upper glass substrate 10 close to the liquid crystal layer 30 is provided with an array of black matrix 101. Each black matrix 101 corresponds to an adjacent region of two of the red color filter unit 203R, the green filter 203G, and the blue color filter unit 203B to prevent light leakage. An ITO common electrode 102 is covered on the array of black matrix 101. Comparing to conventional liquid crystal panel, the problem of misaligning of color filter unit and pixel electrode does not exist so as to increase the aperture ratio of the liquid crystal panel.

However, in this configuration of the liquid crystal panel, the color filter 203 is fabricated on the TFT 201, in the fabrication process of the liquid crystal panel, the color filter 203 is fabricated by photolithography process, and the color filter units 203R, 203G, and 203B with three different colors are fabricated sequentially by three photolithography processes. In order to prevent light leakage, the adjacent two of the color filter units 203R, 203G, and 203B have to connect closely. As shown in FIG. 2, using the red color filter unit 203R and the green color filter unit 203G as an example. A connection portion of the red color filter unit 203R and the green color filter unit 203G is connected closely, and edge portions of the two color filter units are overlapped. At the overlapped portion, there exists a convex portion. The convex portion is called an angle level difference, and an overlapped height is h. If the angle level difference is too large, it will causes many problems such as light leakage between two color filter units. Therefore, in the fabrication process of the color filter, controlling the height h of the angle level difference is required.

SUMMARY OF THE INVENTION

In view of the deficiencies of the prior art, the present invention provides an exposure mask, the exposure mask is mainly applied in the fabrication of the color filter, particularly in the fabrication of the color filter of a liquid crystal panel using COA technology. Using the exposure mask can effectively control the height of the angle level difference.

To achieve the above object, the present invention adopts the following technical solutions: an exposure mask for fabricating a color filter, comprising: a plurality of exposure regions; and a light-shielding region for isolating the plurality of exposure regions, wherein, an edge of each exposure region is provided with multiple first light-shielding patterns spaced apart with each other.

Wherein, an area of each of the first light-shielding pattern ranges from 25 $\mu m^2$ to 100 $\mu m^2$.

Wherein, a shape of each of the first light-shielding patterns is square, rectangular, triangular or rhombic.

Wherein, each spacing between adjacent two of the first light-shielding patterns is equal.

Wherein, a plurality of second light-shielding patterns are further disposed in each exposure region; according to a direction away from the edge of each exposure region, sequentially disposing the first light-shielding patterns and the second light-shielding patterns.

Wherein, a plurality of second light-shielding patterns are further disposed in each exposure region; according to a direction away from the edge of each exposure region, sequentially disposing the first light-shielding patterns and the second light-shielding patterns.

Wherein, each of the exposure regions comprises a first side edge I and the second side edge II disposed correspondingly, the first light-shielding patterns at the first side edge I and the second light-shielding pattern at the second side edge II are corresponding respectively; the second light-shielding patterns at the first side edge I and the first light-shielding patterns at the second side edge II are corresponding respectively.

Wherein, an area of each of the second light-shielding patterns ranges from 6.25 $\mu m^2$ to 25 $\mu m^2$.

Wherein, a shape of each of the second light-shielding patterns is square, rectangular, triangular or rhombic.

Wherein, in each of the exposure regions, a density of the first light-shielding patterns and the second light-shielding patterns ranges from 30% to 90%.

Another aspect of the present invention provides a fabrication method for a color filter, comprising steps of:

(a) providing a lower glass substrate fabricating having an array of thin film transistor (TFT);

(b) fabricating a first insulation protection layer on the array of thin film transistor (TFT); and (c) applying a photolithography process to respectively fabricate color filter units to obtain the color filter;

wherein, the photolithography process a step of fabricating a color photoresist layer and a step of exposing and developing the color photoresist layer; the exposure mask in the exposing uses the above described exposure mask.

Beneficial Effects:

The exposure mask provided by the present invention. When exposing the color photoresist layer, because an edge of each of the exposure regions is disposed with light-shielding patterns, at that portion (that is the overlapped portion by two color filter units), the exposure is insufficient, and therefore, the color photoresist layer is not completely cured, and can be removed when developing so as to control the angle level difference.

DETAILED DESCRIPTION OF THE PREFERRED EMBODIMENT

As described above, the objective of the present invention is to provide an exposure mask which can effectively control the height of the angle level difference in the fabrication process of the color filter.

The exposure mask comprises a plurality of exposure regions and a light-shielding region for isolating a plurality of exposure regions. Edges of the exposure regions are disposed with a plurality of first light-shielding patterns spaced with each other. When exposing the color filter, because the edges of the exposure regions are disposed with the light-shielding patterns, at that portion (that is the overlapped portion by two color filter units), the exposure is insufficient, and therefore, the color photoresist layer is not completely cured, and can be removed when developing so as to control the angle level difference.

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

Embodiment 1

Figure 3:
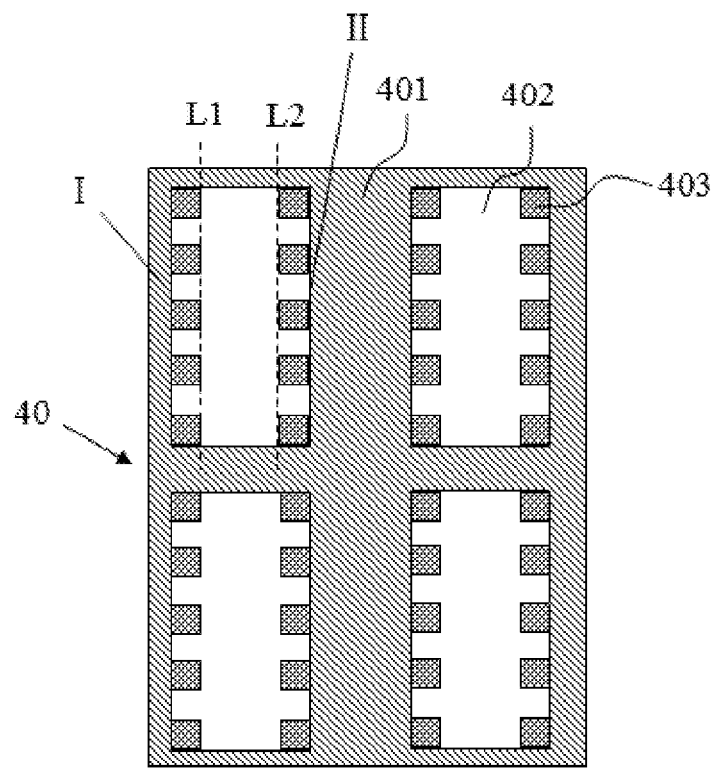
FIG. 3 is a schematic diagram of an exposure mask according to a first embodiment of the present invention.

As shown in FIG. 3, an exposure mask 40 provided by this embodiment includes a plurality of exposure regions 402 and a light-shielding region 401 for isolating the plurality of exposure regions 402 (In FIG. 3, four exposure regions 402 are exemplarily shown, however, this should not be construed as limiting the present invention. The number of the exposure regions 402 and a spacing of adjacent two exposure regions 402 may be determined according to the parameters required to fabricate a color filter unit of a color filter). An edge of each exposure region 402 is provided with multiple first light-shielding patterns 403 spaced apart with each other (In FIG. 3, at two side edges of each exposure region 402, showing five first light-shielding patterns 403 exemplarily and respectively, and this should not be construed as limiting the present invention).

In the present embodiment, each of the first light-shielding patterns 403 is square; the area is 50 $\mu m^2$, and each spacing between adjacent two of the first light-shielding patterns is equal. Each spacing is equal to the side length of the light-shielding pattern; therefore, it can be considered that in the exposure region 402, the first light-shielding patterns 403 have a density of 50%. Of course, in another embodiment, the shape of the first light-shielding pattern 403 may be selected to be rectangular, triangular or prism, and may be other shapes. The area of each first light-shielding pattern 403 may range from 25 $\mu m^2$ to 100 $\mu m^2$. The spacing between adjacent two of the first light-shielding patterns may be not equal, and the density of the first light-shielding patterns 403 could range from 30% to 90%.

It should be noted that, in the present invention, the calculation method of the density of the light-shielding patterns is as following: at each side of the exposure region, through the points on the light-shielding patterns which are closest to the center of the exposure region measuring by vertical distance, making a straight line parallel to the edge of the exposure region. The region enclosed by the straight line and the corresponding edge of the exposure region is a total region. A ratio of all of the light-shielding patterns to the total region is the density of the light-shielding patterns.

Specifically, in the present embodiment, with reference to FIG. 3, at two sides of the exposure region 402, through the points on the light-shielding patterns which are closest to the center of the exposure region measuring by vertical distance, making a straight line L1 parallel to a first edge I of the exposure region 402 and a straight line L2 parallel to a second edge II of the exposure region 402 to obtain the straight lines L1 and L2. An area sum of a region between the straight line L1 and the first edge I and a region between straight line L2 and the second edge II is a total area. A ratio of an area sum of all of the first light-shielding patterns 403 to the total area is the density of the light-shielding patterns 403. In this embodiment, because each of the first light-shielding patterns 403 is square and the areas are equal, and each spacing between adjacent two of the first light-shielding patterns is equal, and each spacing is equal to a side length of the light-shielding pattern. Therefore, the density of the first light-shielding patterns 403 is 50%.

In a negative lithography process, first coating a color photoresist layer on a substrate; then, providing with an exposure mask on the color photoresist layer, and the photoresist layer is exposed. The color photoresist layer is cured by light; finally, developing and removing an unexposed region of the color photoresist layer and the remaining portion is the cured portion of the color photoresist layer so as to form color filter units of the color filter. When exposing using the exposure mask 40 provided by the present invention, because the light-shielding patterns 403 are disposed at the edge of the exposure region 402 of the exposure mask 40, at that portion of the color resist layer (that is the overlapped portion by two color filter units), the exposure is insufficient, therefore, the color resist layer is not completely cured, and the uncured portion can be removed when developing so as to control the angle level difference. The conventional exposure mask without any optimization and exposing, the height of the angle level difference is about 0.9 um to 1.2 um in COA product. Using the exposure mask provided by the present embodiment for exposing can compress the angle level difference below 0.5 um in COA product.

Figure 1:
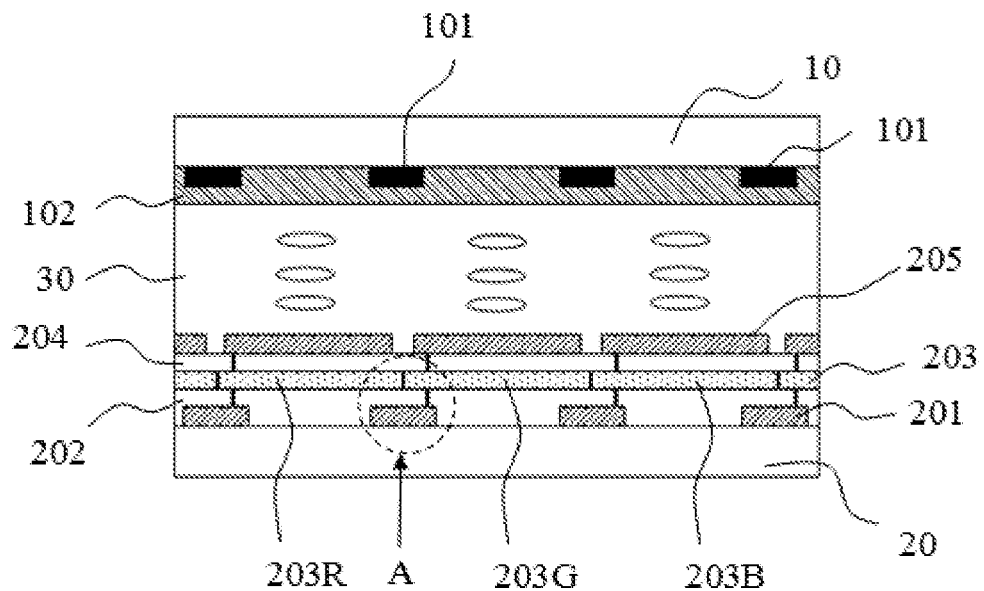
FIG. 1 is a schematic structure diagram of a liquid crystal panel in the conventional COA technology.
Figure 2:
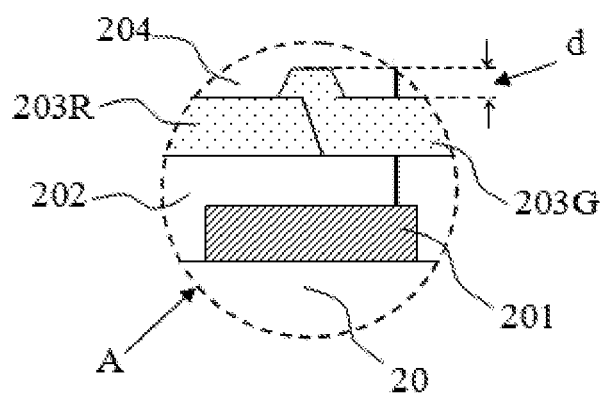
FIG. 2 is a partial enlarged view of portion "A" in FIG. 1.

With reference to FIG. 1-3, the following combined with the fabrication process of the liquid crystal panel of COA technology shown in FIG. 1 for illustrating the application of exposure mask 40 for the fabrication process of the color filter. The fabrication process of the liquid crystal panel of the COA technology with reference to FIG. 1 comprises steps of:

(1) providing an upper glass substrate 10, fabricating an array of black matrix 101 on a side of the glass substrate 10, and fabricating an ITO common electrode 102 on the array of black matrix 101.

(2) providing a lower glass substrate 20, fabricating an array of thin film transistor (TFT) 201 on a side of the glass substrate 20, fabricating a first insulation protection layer 202 on the array of thin film transistor (TFT) 201.

(3) Fabricating a color filter 203 on the first insulation protection layer 202 by applying photolithography process; specifically, first, coating a red photoresist layer on the first insulation protection layer 202; then, disposing the exposure mask 40 provided by the present embodiment at the red photoresist layer for exposing, at the exposure region 402, the red photoresist layer is cured by light; finally, developing and removing an unexposed region in the red photoresist layer. The remaining cured portion of the red photoresist layer forms a red color filter unit 203R. Referring to the step of fabricating the red color filter unit 203R, respectively fabricating a green color filter unit 203G and a blue color filter unit 203B, and finally, obtaining the color filter 203.

(4) fabricating a second insulation protection layer 204 and pixel electrodes 205 on the color filter 203 sequentially, wherein, the pixel electrode 205 connects to TFT 201, and each pixel electrode 205 respectively corresponds to one red filter unit 203R or one green filter unit 203G or one blue color filter 203B of the color filter 203; usually, a transparent passivation layer is disposed on the pixel electrodes 205.

(5) pressing the upper glass substrate 10 and the lower glass substrate 20 to form a liquid crystal cell, wherein, a side of the upper glass substrate 10 fabricated with the ITO common electrode 102 faces to a side of the lower glass substrate 20 fabricated with the pixel electrodes 205.

(6) injecting liquid crystal into the liquid crystal cell to form a liquid crystal layer 30 to obtain the liquid crystal panel with COA technology.

With respect to the conventional liquid crystal panel, the liquid crystal panel using the COA technology does not exist the problem of misaligning of color filter unit and the pixel electrode, therefore, the aperture ratio of the liquid crystal panel can be increased.

Embodiment 2

Figure 4:
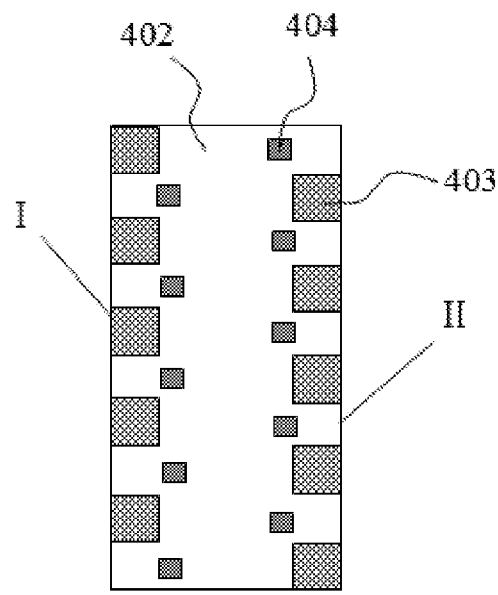
FIG. 4 is a schematic diagram of an exposure mask according to a second embodiment of the present invention.

The difference comparing to the first embodiment is: in the technical solution of this embodiment, the light-shielding patterns disposed at the edge of the exposure region 402 are improved. As shown in FIG. 4, the light-shielding patterns includes a first light-shielding patterns 403 and a second light-shielding patterns 404, wherein, the disposition of the first light-shielding patterns 403 is the same as the embodiment 1. Between adjacent two of the first light-shielding pattern 403, a second light-shielding pattern 404 is provided, and the second light-shielding patterns 404 are closer to a center of exposure region 402 with comparing to the first light-shielding patterns 403. That is, using the edge of the exposure region 402 as a reference, according to a direction away from the edge, first disposing a layer of the first light-shielding patterns 403, then, disposing a layer of the second light-shielding patterns 404.

In the present embodiment, adding the second light-shielding patterns 404 between the first light-shielding pattern 403 and the exposure region 402, the area of the second light-shielding patterns 404 is smaller as a transitional light-shielding pattern such that a transition of the exposure amount is smoother. Using the exposure mask provided by the present embodiment, the height of the angle level difference (film thickness) does not change rapidly.

In the present embodiment, with reference to FIG. 4, for the corresponding first side edge I and the second side edge II of the exposure region 402, the first light-shielding patterns 403 at the first side edge I and the second light-shielding patterns 404 at the second side edge II are corresponding respectively. The second light-shielding patterns 404 at the first side edge I and the first light-shielding patterns 403 at the second side edge II are corresponding respectively.

In the present embodiment, each of the second light-shielding patterns 404 is square, an area of second light-shielding patterns 404 is 16 $\mu m^2$. A density of the first light-shielding pattern 403 and the second light-shielding pattern 404 is 70%. Of course, in another embodiment, the shape of each second light-shielding pattern 404 may be selected to be rectangular, triangular or prism, and may be another shape, an area of each second light-shielding pattern 404 ranges from 6.25 $\mu m^2$ to 25 $\mu m^2$.

In summary, the present invention provides an exposure mask which can effectively control the height of the angle level difference in the fabrication process of the color filter. The exposure mask comprises a plurality of exposure regions and a light-shielding region for isolating a plurality of exposure regions. Edges of the exposure regions are disposed with a plurality of first light-shielding patterns spaced with each other. When exposing the color filter, because the edges of the exposure regions are disposed with the light-shielding patterns, at that portion (that is the overlapped portion by two color filter units), the exposure is insufficient, and therefore, the color photoresist layer is not completely cured, and can be removed when developing so as to control the angle level difference.

It should be noted that, herein, relational terms such as first and second, and the like are only used to distinguish one entity or operation from another entity or operation. It is not required or implied that these entities or operations exist any such relationship or order between them. Moreover, the terms "comprise," include," or any other variation thereof, are intended to cover a non-exclusive inclusion, such that a series of elements including the process, method, article or device that includes not only those elements but also other elements not expressly listed or further comprising such process, method, article or device inherent elements. Without more constraints, by the statement "comprises one . . . " element defined does not exclude the existence of additional identical elements in the process, method, article, or apparatus.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An exposure mask for fabricating a color filter, comprising:
a plurality of exposure regions; and a light-shielding region for isolating the plurality of exposure regions, wherein, an edge of each exposure region is provided with multiple first light-shielding patterns spaced apart with each other, and the multiple first light-shielding patterns are corresponding to an overlapped portion by two color filter units of a color filter;

wherein, a plurality of second light-shielding patterns are further disposed in each exposure region; according to a direction away from the edge of each exposure region, sequentially disposing the first light-shielding patterns and the second light-shielding patterns;

wherein, each of the exposure regions comprises a first side edge I and a second side edge II disposed oppositely, the first light-shielding patterns at the first side edge I are corresponding to and right opposite to the second light-shielding pattern at the second side edge II respectively; the second light-shielding patterns at the first side edge I are corresponding to and right opposite to the first light-shielding patterns at the second side edge II respectively.

2. The exposure mask according to claim 1, wherein, an area of each of the first light-shielding pattern ranges from 25 $\mu m^2$ to 100 $\mu m^2$.

3. The exposure mask according to claim 1, wherein, a shape of each of the first light-shielding patterns is square, rectangular, triangular or rhombic.

4. The exposure mask according to claim 1, wherein each spacing between adjacent two of the first light-shielding patterns is equal.

5. The exposure mask according to claim 1, wherein, an area of each first light-shielding pattern is greater than an area of each second light-shielding pattern, and between adjacent two of the first light-shielding patterns, one of the second light-shielding patterns is provided.

6. The exposure mask according to claim 1, wherein, an area of each of the second light-shielding patterns ranges from 6.25 $\mu m^2$ to 25 $\mu m^2$.

7. The exposure mask according to claim 1, wherein, a shape of each of the second light-shielding patterns is square, rectangular, triangular or rhombic.

8. The exposure mask according to claim 1 wherein, in each of the exposure regions, a density of the first light-shielding patterns and the second light-shielding patterns ranges from 30% to 90%.

9. A fabrication method for a color filter, comprising steps of:
(a) providing a lower glass substrate fabricating having an array of thin film transistor (TFT);
(b) fabricating a first insulation protection layer on the array of thin film transistor (TFT); and
(c) applying a photolithography process to respectively fabricate color filter units to obtain the color filter;

wherein, the photolithography process a step of fabricating a color photoresist layer and a step of exposing and developing the color photoresist layer; an exposure mask for the exposing comprises a plurality of exposure regions; and a light-shielding region for isolating the plurality of exposure regions; an edge of each exposure region is provided with multiple first light-shielding patterns spaced apart with each other, and the multiple first light-shielding patterns are corresponding to an overlapped portion by two color filter units of a color filter;

wherein, a plurality of second light-shielding patterns are further disposed in each exposure region; according to a direction away from the edge of each exposure region, sequentially disposing the first light-shielding patterns and the second light-shielding patterns;

wherein, each of the exposure regions comprises a first side edge I and a second side edge II disposed oppositely, the first light-shielding patterns at the first side edge I are corresponding to and right opposite to the second light-shielding pattern at the second side edge II respectively; the second light-shielding patterns at the first side edge I are corresponding to and right opposite to the first light-shielding patterns at the second side edge II respectively.

10. The color filter fabrication method according to claim 9, an area of each of the first light-shielding pattern ranges from 25 $\mu m^2$ to 100 $\mu m^2$.

11. The color filter fabrication method according to claim 9, wherein, a shape of each of the first light-shielding patterns is square, rectangular, triangular or rhombic.

12. The color filter fabrication method according to claim 9, wherein each spacing between adjacent two of the first light-shielding patterns is equal.

13. The color filter fabrication method according to claim 9, wherein, an area of each first light-shielding pattern is greater than an area of each second light-shielding pattern, and between adjacent two of the first light-shielding patterns, one of the second light-shielding patterns is provided.

14. The color filter fabrication method according to claim 9, wherein, an area of each of the second light-shielding patterns ranges from 6.25 $\mu m^2$ to 25 $\mu m^2$.

15. The color filter fabrication method according to claim 9, wherein, a shape of each of the second light-shielding patterns is square, rectangular, triangular or rhombic.

16. The color filter fabrication method according to claim 9, wherein, in each of the exposure regions, a density of the first light-shielding patterns and the second light-shielding patterns ranges from 30% to 90%.

\* \* \* \* \*